United States Patent [19]

Benson et al.

[11] Patent Number: 4,495,655
[45] Date of Patent: Jan. 22, 1985

[54] TESTABLE OPTICALLY ISOLATED CONTROL CIRCUIT

[75] Inventors: Michael R. Benson; William D. Hill; Garrett G. OBrien; Dennis W. Hollenbeck, all of San Jose, Calif.

[73] Assignee: General Electric Company, San Jose, Calif.

[21] Appl. No.: 442,395

[22] Filed: Nov. 15, 1982

Related U.S. Application Data

[63] Continuation-in-part of Ser. No. 402,368, Jul. 27, 1982.

[51] Int. Cl.³ ............................................. H04B 9/00
[52] U.S. Cl. ........................................ 455/603; 307/571; 340/825.06; 324/418; 455/607
[58] Field of Search ............... 455/603, 602, 606, 607; 324/96, 418, 419, 420, 421, 422, 423, 424; 307/248, 571, 581; 340/825.06

[56] References Cited

U.S. PATENT DOCUMENTS 4,408,131  10/1983  Fox ......................................... 307/571
4,438,356   3/1984  Fleischer ............................... 307/571

FOREIGN PATENT DOCUMENTS

52-43089  4/1977  Japan ............................... 340/825.06
56-52947  5/1981  Japan ..................................... 455/606

Primary Examiner—Joseph A. Orsino, Jr.
Attorney, Agent, or Firm—Ivor J. James, Jr.; Samuel E. Turner; Raymond G. Simkins

[57] ABSTRACT

A testable physically isolated control circuit includes a first unit 10, a second unit 40, and an optical coupler 30 to couple units 10 and 40 together. The functional portion 10a of the first unit includes an input terminal 11 and an oscillator 12 for controlling a first transmitter 17. Signals from the first transmitter are received by a receiver 44 in unit 40 to control the relay 48. Each unit 10 and 40 also includes a testing portion 10b and 40b for monitoring the condition of the functional portions. The testing portion 40b detects the state of the receiver 44 and the relay 48 and transmits this information via transmitter 65 to a receiver 22 in first unit 10. This receiver 22 controls input terminals 29 and 15 to provide control information concerning the proper functioning of the circuit.

5 Claims, 6 Drawing Figures

TESTABLE OPTICALLY ISOLATED CONTROL CIRCUIT

This a continuation-in-part of co-pending U.S. patent application Ser. No. 402,368, filed July 27, 1982.

BACKGROUND OF THE INVENTION

1. Field of the Invention

This invention relates to electric circuits, and in particular, to an optically isolated control circuit which allows continuous monitoring of the circuit being controlled to verify its proper operation.

2. Description of the Prior Art

In the design of many control systems it is frequently desirable to situate the object or device being controlled remotely from the control input signal. Furthermore, in many such installations, for example, nuclear power plants, it is desirable to completely isolate the control device from the control input. Although this has been achieved with prior art control systems, such control systems have typically been unable to monitor the correct operation of the device or object being controlled. For example, in prior art control systems, the control input signal has been supplied to a remotely situated object being controlled using optical or electronic techniques, but the station from which the control input signal was generated has been unable to detect the correct functioning of the isolated controlled system.

Testable optically coupled solid state relay switches are intended to operate continuously and reliably with the greatest possible immunity from their environment, which is a nuclear power plant. The relays are physically shielded by a concrete wall having glass or quartz windows through which light signals optically couple the relay to a controller. The prior art coupling was deficient in that the relay input was responsive to different kinds of light including contamination signals. For example, the relay would not be properly isolated from a fire in the controller on the other side of the wall if light from the fire penetrated the window.

In the normal operation of the reactor, the switch elements continuously conduct a large current to solenoids holding spring loaded valves closed. The continuous current generates heat in the switches, and every degree of heat hastens switch deterioration. Heat dissipation in the switches should be minimized as much as possible.

The switching elements used in the relay should have a fast response time so that the relay can be accurately tested. Using a conventional full-wave rectifying diode-bridge to supply voltage to the switching elements provides a fast diode pump turn-on time, but turn-off time is delayed while the capacitance in the switching elements discharges. A small enough bleed resistor to rapidly discharge this capacitance would dissipate too much heat. Therefore, an improved fast turn-off circuit for voltage supplied by a diode bridge is needed.

Finally, the relay should have high sensitivity to failure of the switch to open. Verification of output contact current switching must preserve the isolation of the contact current. The prior art method connected the output line to a resistor shunt, across which the voltage drop was measured to determine whether current was flowing. The resistor shunt violated the isolation of the contact current.

SUMMARY OF THE INVENTION

This invention provides a testable optically isolated control circuit suitable for use in applications wherein a controlling station and a controlled device must be physically isolated from each other. The invention is particularly useful for applications in which a device is to be controlled which must be physically and electrically separate from the source of the control input, yet have the source continuously able to monitor the transmission, reception, and condition of the controlled device. Typical applications include the control of remotely situated electrical devices in nuclear power plants.

In one embodiment, the testable optically isolated control circuit of this invention includes first and second physically separated units, the first unit including: an input terminal for receiving a control signal, a first transmitter for transmitting the control signal to the second unit, a first sensor for monitoring the first transmitter and supplying a signal indicative of the state of the first transmitter, and a first receiver for receiving signals; and the second unit including: a second receiver for receiving signals from the first transmitter and controlling relay means in response thereto, a second sensor connected to the second receiver and the relay means for detecting their operation, and a second transmitter connected to the second sensor for transmitting signals therefrom to the first receiver. The first unit also includes terminals connected to receive signals from the first sensor and for the first receiver. In the preferred embodiments, each of the transmitters includes an oscillator and at least one logic gate coupled to the transmitter.

It is an object of this continuation-in-part to improve the isolation of an optically controlled circuit by providing a narrow bandpass input frequency detection circuit for the second receiver of the invention.

It is a further object to improve the operation verification of an optically-controlled relay by deriving the relay switch drive signal from a phase lock loop oscillator which also provides a precisely alternating verification signal to a second transmitter comprising two light-emitting diodes.

It is an additional object to verify in a more isolated manner the current flow through output contacts by providing a transformer having two windings and passing the output contact current through one winding to choke the other winding carrying an alternating current to a second transmitter including a trigger and a light-emitting diode.

It is another object of this invention to provide a controlled relay circuit which dissipates less heat by the use of a full wave switch comprising a plurality of field effect transistors.

It is yet a further object of this invention to provide a fast turn-off circuit for a full wave switch.

The invention of this continuation-in-part obtains improved isolation, performance, and operation verification in an optically-controlled high current relay switch by providing a narrow bandpass tuned input filter, a phase-locked loop oscillator actuated by signals passing the input filter and producing a clock signal to drive later stages of the relay, switch elements comprising a plurality of low heat dissipating FET transistors, a fast turn-off circuit actuated by, and speeding up, a decrease in control voltage to the FETs, and an output current verification transformer which is saturated by the flow of output current and turns off the clock signal to an LED in the second transmitter which remains off while output current flows.

Other objects, features and advantages of this invention follow:

BRIEF DESCRIPTION OF THE DRAWING

FIGS. 2, 3, and 4 are connected;

DETAILED DESCRIPTION OF THE PREFERRED EMBODIMENT

Figure 6:
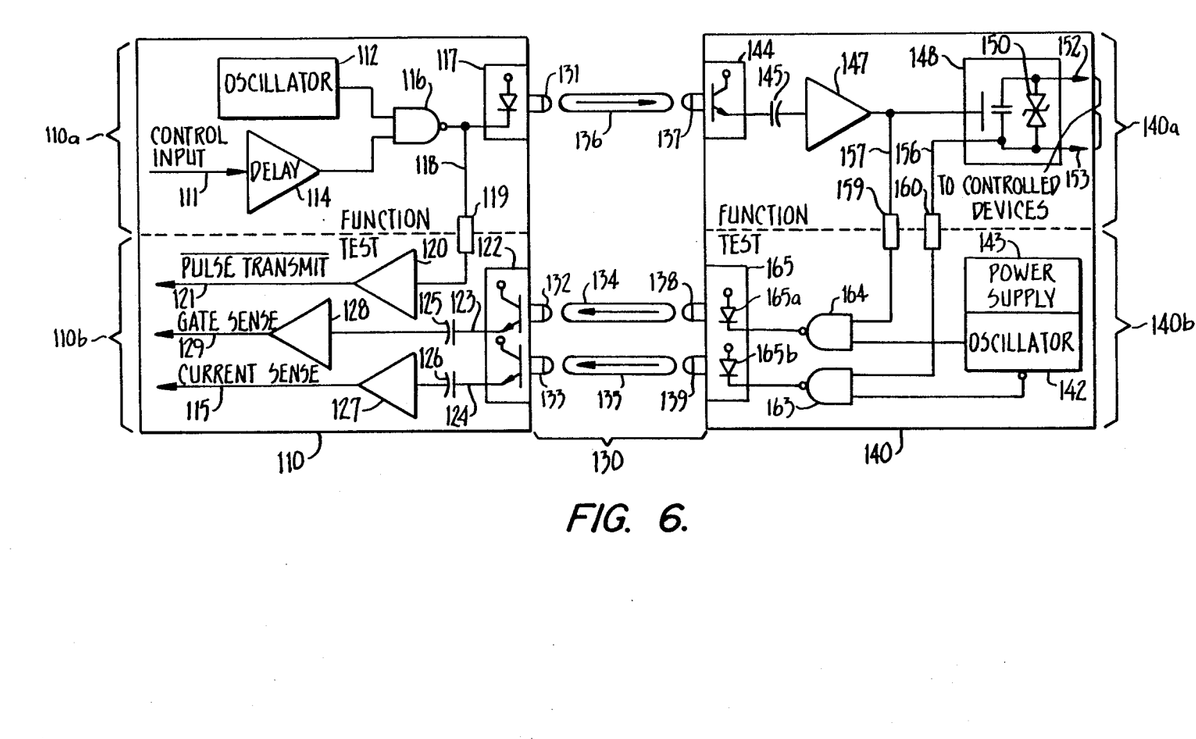
FIG. 6 illustrates the relation of the first and second units in the parent patent application.

As shown generally in FIG. 6, the parent invention includes a first unit 110, a second unit 140, and means 130 for communicating between the two units. In the preferred embodiment, units 110 and 140 are physically and electrically separate from each other, and are coupled together using optical techniques. As shown, each unit 110 or 140 includes an upper functional section 110a or 140a which, as will be explained, is used to control the desired device, and a lower test section 110b or 140b which monitors the operation of the functional section to assure the proper control signals are being transmitted and received, and that the controlled device 140 is being correctly controlled.

Figure 5:
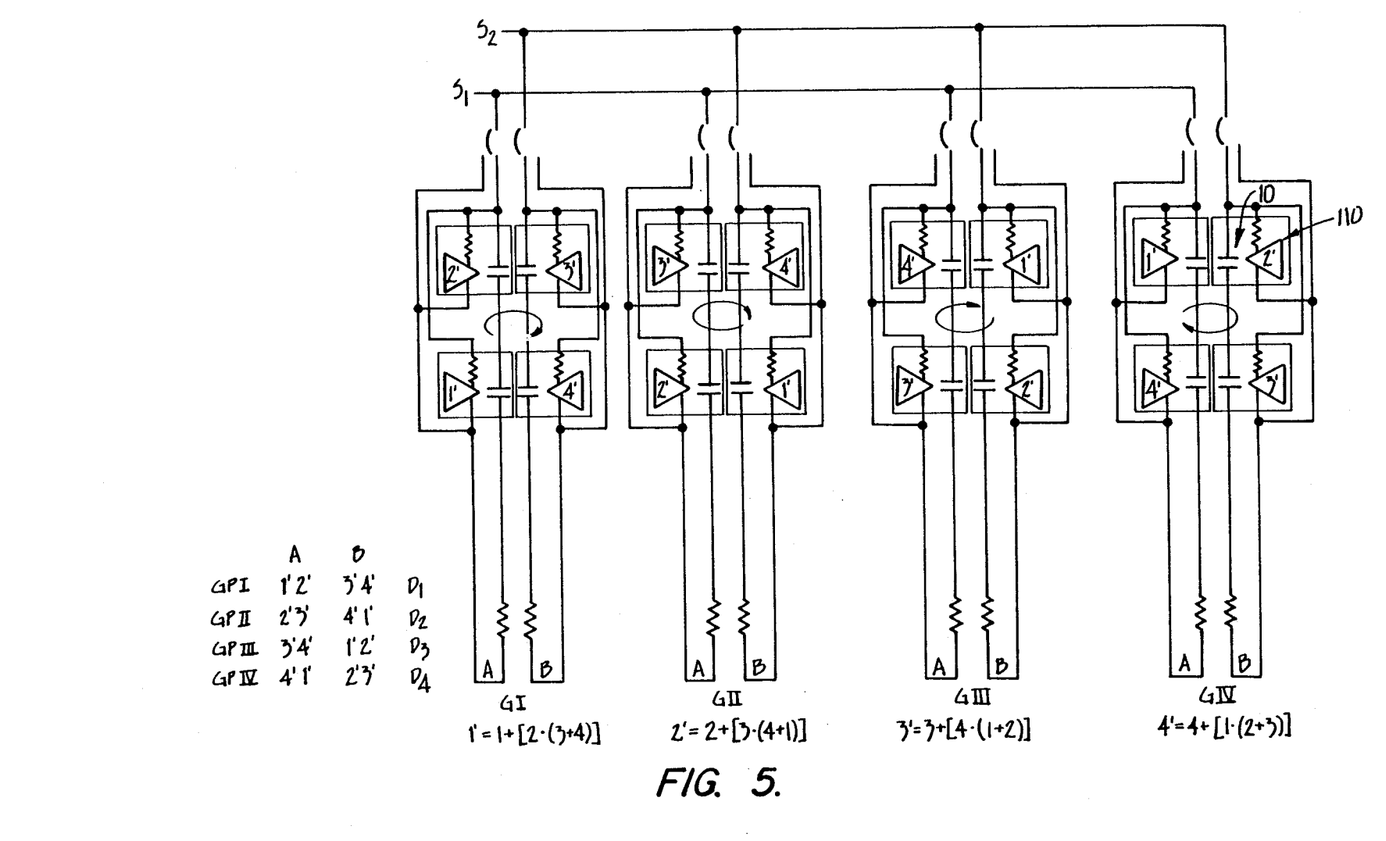
FIG. 5 illustrates placement of the circuit cards in a nuclear system for enabling discrete tests of the units without emergency shutdown and upon a failure of power causing overall system SCRAM.

The functional section of unit 110 includes a terminal 111 to which the desired control input signal is supplied. The control input signal will be generated using well-known apparatus not shown in FIG. 5. For example, known sensors may detect temperature or other desired parameters and supply appropriate control inputs on line 111 to regulate the state of a control device coupled to lines 152 and 153 in unit 140. Any desired filtering, delay, or amplification of the control input signal will be performed by unit 114 before the control input signal is supplied to a first terminal of NAND gate 116. An oscillator 112 is coupled to the other terminal of NAND gate 116, and the output of NAND gate 116 is coupled to the first transmitter 117. Because in the preferred embodiment the coupling 130 between the input unit 110 and the output unit 140 is optical, oscillator 112 has a pulse rate of 100 kHz to eliminate potential interference with ordinary 60 Hertz light sources. The 100 kHz signal from oscillator 112 coupled to control input 111 through gate 116 causes the light-emitting diode in first transmitter 117 to pulse at this rate, and these pulses are detected by the photo diode in receiver 144 in unit 140.

Because in the preferred embodiment the units 110 and 140 are used in conjunction with control systems in a nuclear power plant, a relatively thick wall of steel, concrete, or other impervious material may be interposed between units 110 and 140. Transmission of light through such a wall, while retaining its isolation, is achieved by a first lens 131, a quartz tube 136, and a second lens 137. Of course, in installations where such rigorous isolation is not necessary, the transmission between first transmitter 117 and receiver 144 may be achieved using other known techniques.

Receiver 144 is capacitively coupled through capacitor 145 to amplifier 147. This, in effect, creates a filtered retriggerable multivibrator. Capacitor 145 limits the bandwidth of the transmitted signal to reject any 60 Hz noise and higher frequency noises.

As long as light pulses continue to cross the optical boundary 130 to the output unit 140, this multivibrator section will hold a DC load-activating signal. The load-activating signal drives relay 148 to control the device connected to lines 152 and 153. A surge protection diode 150 is commonly included in relay 148.

To assure the highest reliability of the functional portions of the units 110 and 140, their condition is continually monitored by the test portions 110b and 140b of units 110 and 140, respectively. Line 118 in unit 110a is connected to continuously receive the output signals from gate 116 driving transmitter 117. This line is connected through resistance 119 and inverter 120 to terminal 121. Terminal 121 therefore will continuously present a signal complementary to the output signal from gate 116. Terminal 121 will be connected to other known monitoring circuitry which may be used to sound an alarm, activate a redundant control system, or perform other known functions should the control input supplied to terminal 111 and the inverted pulse transmit signal on terminal 121 be of incorrect phase with respect to each other.

A tap formed by line 157 is made between amplifier 147 and relay 148. This line is connected through resistance 159 to one terminal of NAND gate 164. The other terminal of NAND gate 164 is connected to oscillator 142, which is driven by a remotely situated power supply 143. The output from gate 164 drives a light-emitting diode 165a within second transmitter 165.

A second tap 156, typically a single loop coil, is made within relay 148 to permit continuous monitoring of its condition. This tap is connected through resistance 160 to one terminal of NAND gate 163. The other terminal of gate 163 is connected to oscillator 142 and drives a second light-emitting diode 165b within transmitter 165.

In the same manner as described in conjunction with transmitter 117, transmitter 165 produces signals which are detected by receiver 122. The light output from the light-emitting diode coupled to gate 164 is transmitted via lens 138, quartz tube 134, and lens 132 to the photo diode connected to line 123. In a similar fashion, the output from gate 163 is transmitted through lens 139, quartz tube 135, and received by lens 133, where it controls the photo diode coupled to line 124. Capacitors 125 and 126 are connected to lines 123 and 124 to provide the same function as capacitor 145, explained above.

The outputs from receiver 122 are then capacitively coupled using capacitors 125 and 126 to amplifiers 127 and 128, which, in turn, control nodes 115 and 129. The signal supplied to node 129 indicates the proper reception of the transmitted control signal, while the signal supplied to node 115 is indicative of the proper operation of relay 148. Nodes 115 and 129 may be connected to monitoring equipment similar to that connected to node 121.

Table 1, below, illustrates the overall operation of the units 110 and 140.

TABLE 1

| | INPUT UNIT 10 | OUTPUT UNIT 40 | |
|---|---|---|---|
| Control 11 | Pulse Transmit L.E.D. 117 | Gate Sense L.E.D. 165 | Current Sense L.E.D. 165b |
| "OFF" | No Light | No Light | Light Pulse Transmission |
| "ON" | Light Pulse Transmission | Light Pulse Transmission | No Light |

Of particular advantage is that the proper operation of units 110 and 140, and the intervening lenses and tubes 130 may be verified by activating control signal 111 for short times, on the order of milliseconds, without activating the controlled device. When such a test is performed, the outputs 121, 129 and 115 of the test circuit in unit 110b should all change states for that time, yet by appropriate control of duration of the pulse the controlled device, with its typically relatively greater mass, will not change state. The invention therefore provides a higher reliability physically isolated control system, all parts of which are continually monitored for proper operation. The control system allows on-line testing of its proper function.

This continuation-in-part is for an isolated relay 10 which is an improvement of the second receiver 140. The relay 10 closes switch 60 to supply current to a solenoid 99 which actuates a valve, not shown, in a compressed air control rod driver for a reactor, not shown. When it is desired to run the reactor with control rods retracted from the core, the switch 60 is closed to supply alternating current to solenoid 99 and overcome a spring, not shown, to hold the valve closed. When an emergency requires inserting a control rod into the reactor core, or if the reactor protection system fails in some other way, the contacts should open to cut off the current to the solenoids and allow the spring loaded valves to release compressed air and drive the control rods into the core.

There are two relay switches 10 supplying current to each of two solenoids which control respective valves in the compressed air line to a single control rod. One relay 10 comprises the invention of the continuation-in-part. At least two and at most three switch contacts must be open concurrently to cut off current to both solenoids and release both valves. The four switches are individually controlled by four separate "divisions" of the reactor facility. Besides providing extra safety, relay redundancy allows the relays to be tested individually without releasing compressed air and "scramming" the reactor. Each relay must be isolated as much as possible from its controlling division and controller 110, communicating only by very specific optical signals 13, 28 and 96.

Figure 2:
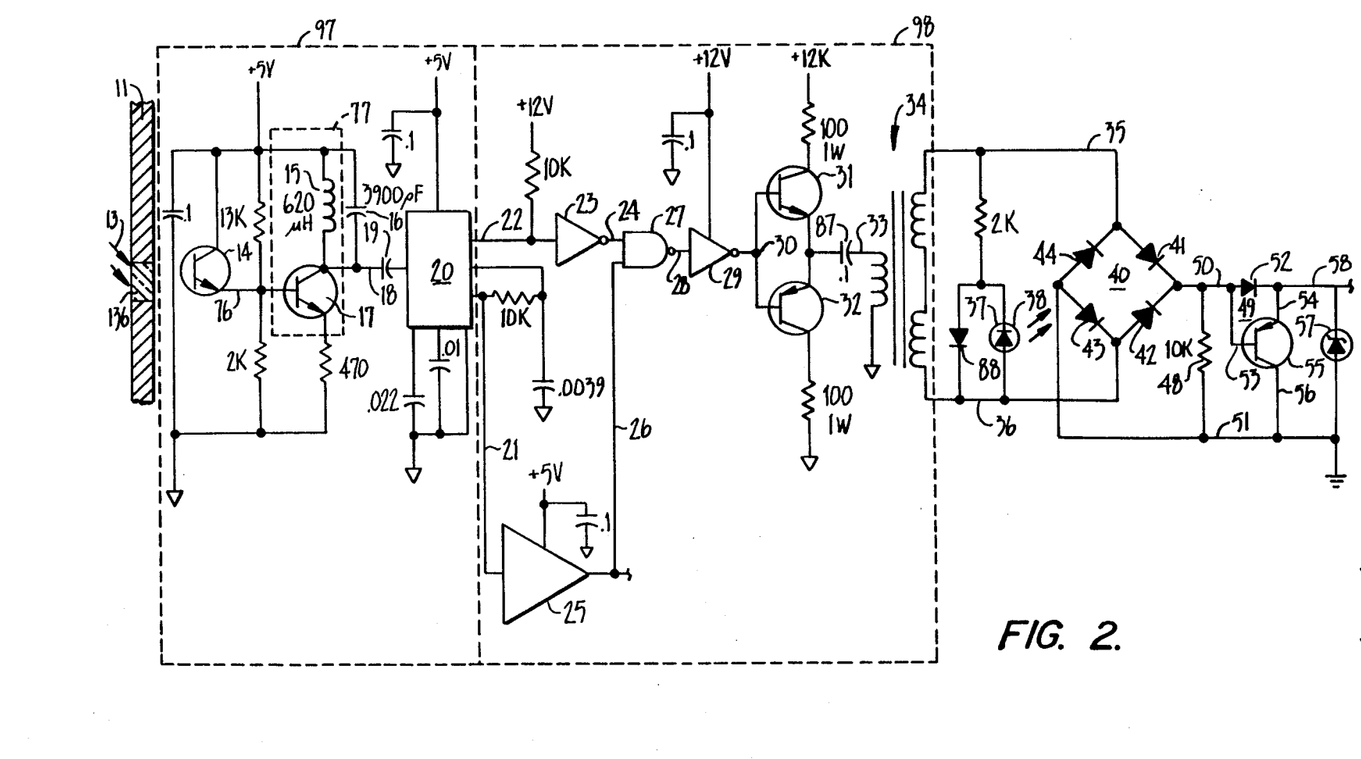
FIG. 2 is a schematic of the frequency detection circuit and transformer isolator circuit in the second receiver.
Figure 3:
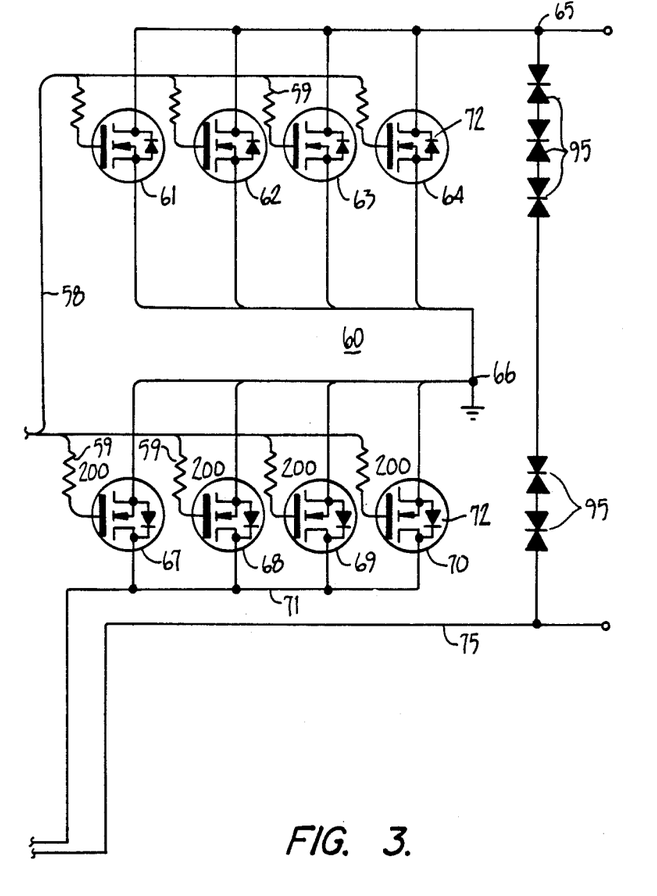
FIG. 3 is a schematic of the isolated switching elements in the second, receiver.
Figure 4:
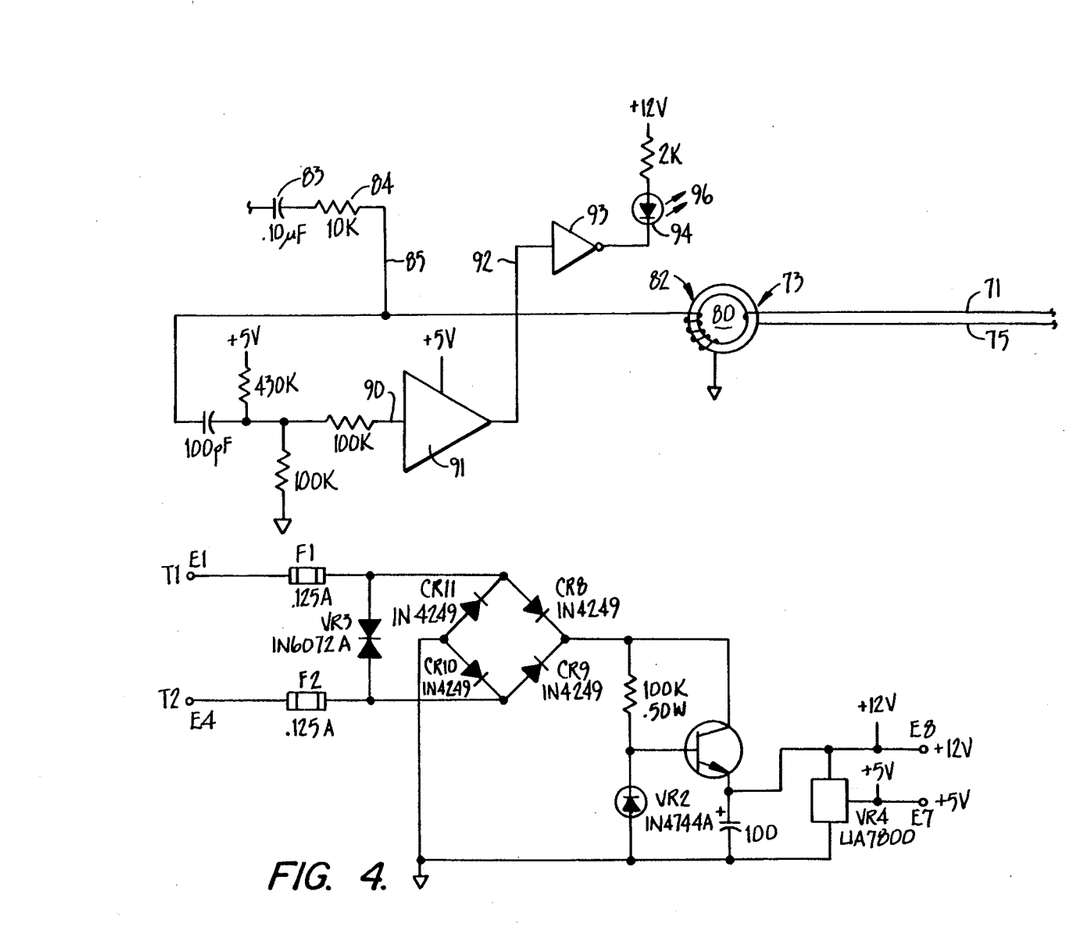
FIG. 4 is a schematic of the power supply and isolated current sensing transformer in the second receiver.

In FIGS. 2, 3, and 4, all capacitances are in microfarads, all resistances are in ohms, and resistor values are 0.250W, unless otherwise specified. Referring especially to FIG. 2, the relay switch 10 is on a circuit card isolated from its division and from unit 110 by a concrete wall 11 in region 130 of FIG. 6 having a glass or quartz window 136 through which a light pulse signal 13 passes. The pulse is received by light-sensitive transistor 14, which replaces receiver 144 in the parent patent application. Transistor 14 produces a current at the frequency of signal 13 in its emitter lead 76. Tuned circuit 77 includes inductor 15, preferably 620 microhenrys, capacitor 16, preferably 3900 picofarads, and a five-volt supply. Circuit 77 has a characteristic frequency of 100 kilohertz. A 100 khz pulse on line 76 to the base of transistor 17 of circuit 77 causes a current through the collector of 17 which resonates with inductor 15 and capacitor 16, and produces an amplified 100 khz signal on line 18. Tuned circuit 77 has very low gain at 60 hz, which is the most common background noise, and no DC gain. Capacitor 19, preferably 0.001 microfarads, blocks DC current which would flow through inductor 15 during nonresonating intervals.

Oscillator 20 is a standard phase-locked loop tone decoder which locks onto 100 khz input signals, rejects signals that vary more than seven percent, and produces a 100 khz clock signal at its output 21. When oscillator 20 is locked on 100 khz it produces a digital low signal, and when unlocked a digital high signal, at its output 22. The digital signals are passed through inverting Schmidt trigger 23 to line 24, the oscillating signal on line 21 is passed through level shifter 25 to line 26, and lines 24 and 26 are input to NAND gate 27, which produces another 100 khz signal at its output 28. The signal on line 28 is amplified and inverted by amplifier 29. Thus, the effect of devices 23, 25, 27 and 29 is to amplify, invert, and shape the 100 khz signal, which is applied to line 30 to the bases of complementary bipolar transistors 31 and 32. Transistor 31 amplifies the high voltage portions of the oscillating signal while transistor 32 amplifies low voltage portions, producing an oscillating signal power-amplified to twelve volts at input 33 to transformer 34. Capacitor 87, preferably 0.1 microfarads removes D.C. voltage introduced by the shaping amplifiers. Transformer 34 is a "chopper" having a coil ratio of 1:1:1 and producing another 12 volt oscillating signal between transformer output leads 35 and 36. Ground faults in input line 33 are isolated by the transformer.

Infrared light emitting diode (LED) 37 transmits light pulses 38 exhibiting the output of transformer 34. LED 37 is analogous to, but not the same as, LED 165a in the parent application. A 100 khz light pulse 38 from LED 37 verifies that a correct 100 khz input signal was received and passed by tuned circuit 77, amplifying and shaping devices 23, 25, 27 29, 31 and 32, and isolating transformer 34. Signal 38 is transmitted through window 112, FIG. 6. Diode 88 protects LED 37 when the transformer output polarity reverses.

The 12 volt alternating current between lines 35 and 36 is applied to full-wave rectifying diode bridge 40 comprised of diodes 41 and 42 which have their cathodes connected to line 50 and diodes 43 and 44 which have their anodes connected to line 51. Thus, the 12 volt AC signal between lines 35 and 36 is reduced two diode-voltage drops and rectified to produce a positive 10.6 DC voltage on line 50, and an isolated ground voltage on line 51.

Figure 1:
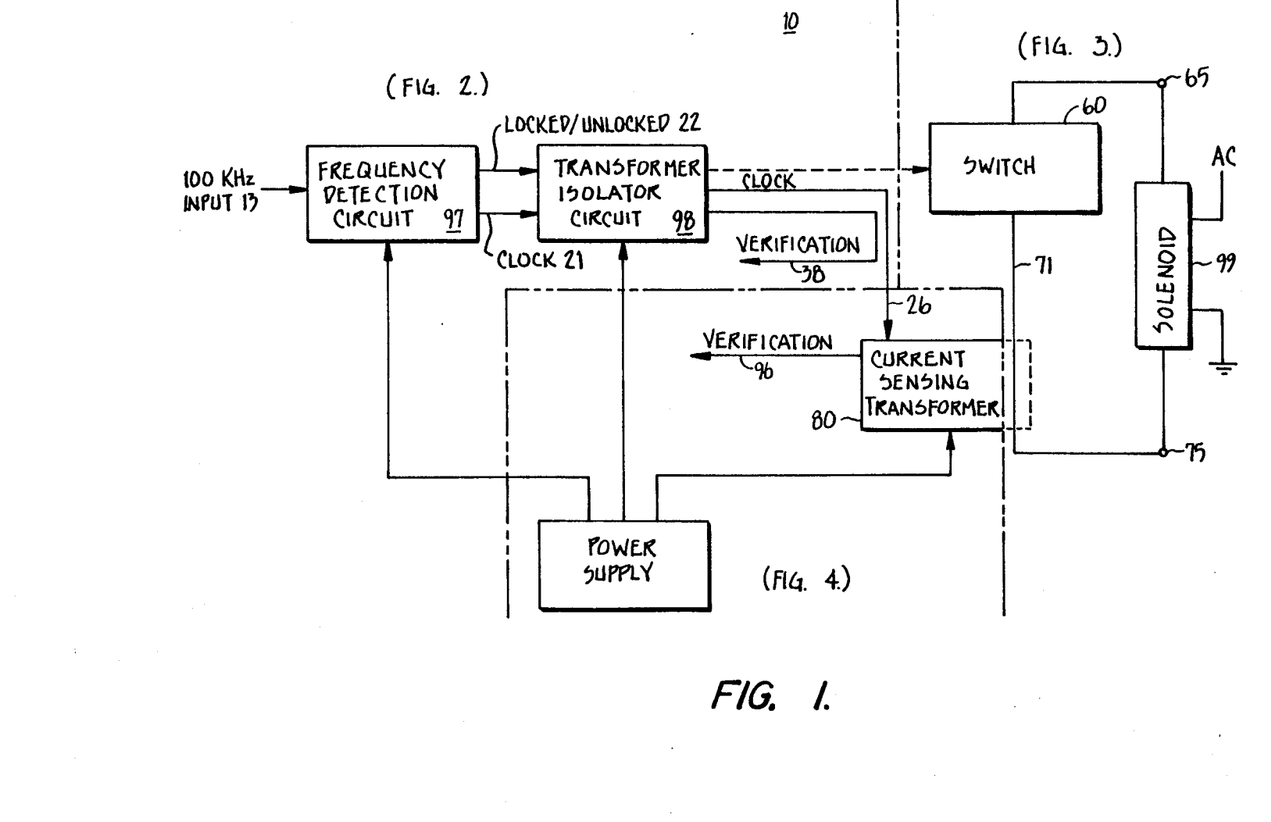
FIG. 1 is a simplified block diagram of the second receiver in the embodiment of the continuation-in-part of this invention, showing how

Referring to FIG. 3, the positive 10.6 volts on line 50 provides the turn-on voltage on line 58 for field effect transistor (FET) array 60. Array 60 comprises two rows 61–64 and 67–70 of N-channel FETs, the transistors within each row being interconnected in parallel. Each transistor internally has the cathode of a diode 72 connected to its drain and the anode to its source. In the preferred embodiment, the transistor/diode combination is a "Hexfet" produced by the International Rectifier Company. All the FETs 60 have their gates connected, preferably through a respective 200 ohm resistor 59, to line 58 and their sources connected to isolated ground terminal 66. Terminal 6 is connected to negative or ground line 51 of rectifier 40 (FIG. 2). Hexfets 60 turn on so fast that when connected in parallel their differential turn-on voltage will cause oscillations in the drains 71 and 65. Resistors 59 are parasitic oscillation suppressors which prevent this oscillation. The drains of FETs 61–64 are connected together at switch contact node 65, and the drains of FETs 67–70 are connected together to line 71, which is connected through current sensing transformer 80, to be described, to switch contact 75. A voltage above positive 6 volts on line 58 puts the FET gates in a conducting state; conduction of the FETs of array 60 connects contact 65, ground 66 and line 71 together and to contact 75 through the winding 73 (FIG. 4) of sensing transformer 80 whereby switch contacts 65 and 75 are in effect closed thereby completing the circuit for applying the AC operating current to the solenoid 99 (FIG. 1). The contacts 65 and 75 correspond to terminals 152 and 153 in the parent patent application. Diode 57 (FIG. 2) between line 58 and the isolated common ground 51 prevents excessive voltage transients that could damage the Hexfet gates. Current flowing through the contacts 65 and 75 energizes solenoid 99 (FIG. 1) to hold the spring-loaded valves, not shown, closed on compressed air lines.

Interrupting the 100 khz optical input signal to phototransistor 14 cuts off the voltage on line 58 and the FETs stop conducting, interrupting the current through contacts 65 and 75. It is desirable to have FETs 60 stop the current flow through contacts 65 and 75 as fast as possible. Each gate has a significant capacitance which must be discharged to turn off the FET, and this is done by bleed resistor 48 and turn-off circuit 49, FIG. 2. Once transformer 34 stops producing current between lines 50 and 51, resistor 48 of preferably 10K ohms begins discharging the capacitance in line 50. Diode 52 provides the positive current flow in line 50 to line 58. When the voltage on line 50 and the base lead 53 of transistor 55 is approximately 0.7 volts less than line 58, transistor 55 begins conducting, through its emitter 54 and collector 56 to ground, and rapidly discharges the approximately 32,000 picofarads of charge remaining on gate terminal line 58 to turn off output devices 60.

Diodes 95 are back-to-back zeners having a breakdown voltage of around 300 volts. These diodes prevent the inductive kick from the solenoids from exceeding the 400 volt rating of the Hexfets. Diodes 95 correspond to diode 150 in the parent patent application.

Referring to FIG. 4, verification that FETs 60 have stopped conducting is provided by current sensing transformer 80, which has a small core with a square loop characteristic. Line 71 is connected to output contact 75 by a first winding 73 having three turns in transformer 80. The normal current through the solenoid 99, or any current above 5 amps, saturates transformer 80 and prevents it from functioning as a transformer. Winding 82 is connected through preferably 0.10 microfarad capacitor 83 and preferably 10K ohm resistor 84 to the 100 khz clock signal 26 from level shifter 25 in FIG. 2. When transformer 80 is saturated winding 82 is a very low impedance on input line 85, and the 100 khz voltage from winding 82 does not represent a logic "1" to the CMOS gate 91. As long as current flows through contacts 65 and 75, there is no output from gate 91. When the current through the contacts and through winding 73 stops, transformer 80 begins functioning as a transformer with a high impedance inductance, the voltage in lines 85 and 90 increases, and the CMOS gate 91 begins passing the 100 khz signal from line 85. The 100 khz signal on trigger output line 92 is amplified and inverted by inverter 93, and activates LED 94. Light pulses 96 from LED 94 signify that the circuit between the contacts has been broken. They are transmitted through a third glass window 136 (FIG. 6) back to a controller such as unit 110 to indicate switch contact opening. LED 94 is analogous to LED 165b in the parent patent application. Transmission by LED 94 while a 100 kHz signal is being transmitted to LED 14, FIG. 2, indicates a malfunction of the card. No transmission by LED 94 when no signal 13 is sent to LED 14 likewise indicates a malfunction.

Although a preferred embodiment of the invention has been described above, this embodiment is intended to illustrate the invention rather than limit it. It will be obvious to those of ordinary skill in the art that various modifications may be made to this system without departing from the scope of the invention. For example, radio signals or other means may be used to communicate between the two physically separated units. The scope of the invention may be determined from the following claims.

We claim:

1. In an electronic relay switch of the type controlled by an alternating input signal, and providing an operation verification output signal to, a controller from which said relay switch is otherwise isolated, said switch having an isolated ground terminal, and full wave rectifying means to rectify said alternating signal into a switch actuating control voltage, the improvement therewith comprising:
   a frequency detection circuit including a narrow bandpass input filter connected to receive said alternating input signal and providing an alternating control signal to said rectifying means;
   switch elements including first and second pluralities of hexfet transistors having drain leads connected to first and second nodes respectively, source leads connected to said isolated ground terminal, and gate leads connected to said rectifying means for receiving said switch actuating control voltage;
   a fast turn-off circuit connected between said rectifying means and said gate leads for rapidly discharging the gate capacity of said hexfet transistors;
   operation verification means including a switch current sensing transformer having two windings, a first of said windings being connected in series with said hexfet transistors between said first and second nodes whereby current in said first of said windings controls the voltage across the second of said windings; and
   means controlled by said voltage across said second of said windings for providing said operation verification signal.

2. A switch as in claim 1 including a diode having its anode connected to said rectifying means and its cathode connected to the gates of said hexfet transistors and an npn bipolar transistor having its collector connected to said isolated ground, its base connected to the anode of said diode and its emitter connected to the cathode of said diode.

3. A switch as in claim 1 wherein said current sensing transformer is saturated by said current in said first winding whereby the impedance of said second winding is low in the presence of said current and high in the absence of said current; means for applying an alternating current signal to said second winding; and means responsive to the voltage across said second winding when the impedance thereof is high for providing an optical signal indicative of the absence of said current.

4. A switch as in claim 1 wherein said frequency detection circuit includes a tuned narrow bandpass input filter which comprises:
- an electrical signal input terminal for receiving said alternating input signal;
- a tuned circuit output terminal;
- a positive voltage supply terminal;
- an npn bipolar transistor having a base connected to said input terminal, and a collector connected to said output terminal; and
- an inductor and a capacitor network connected in parallel between said voltage supply terminal and said collector, said inductor and capacitor together having a resonant frequency of approximately 100 kilohertz, whereby a 100 Khz signal at said input terminal causes said transistor to operate in resonance with said network to produce a 100 Khz signal at said output terminal.

5. A switch as in claim 4 wherein said frequency detection circuit further comprises:
- an oscillator input connected to said tuned circuit output terminal;
- an oscillator digital output terminal;
- an oscillator clock output terminal; and
- a phase lock loop oscillator which locks onto a 100 Khz signal on the oscillator input and rejects signals varying more than seven percent from 100 Khz, and which produces high and low level logic signals at said digital output terminal indicative of whether said oscillator is locked and which then locked produces a 100 Khz signal at said clock output terminal.

* * * * *